(12) United States Patent
Fukuda et al.

(10) Patent No.: US 11,732,318 B2
(45) Date of Patent: Aug. 22, 2023

(54) METHOD FOR MANUFACTURING MAGNETOSTRICTIVE TORQUE SENSOR SHAFT

(71) Applicant: NSK LTD., Tokyo (JP)

(72) Inventors: Kota Fukuda, Kanagawa (JP); Junji Ono, Kanagawa (JP); Teruyuki Nakamura, Tokyo (JP); Yuta Sugiyama, Tokyo (JP)

(73) Assignee: NSK LTD., Tokyo (JP)

( * ) Notice: Subject to any disclaimer, the term of this patent is extended or adjusted under 35 U.S.C. 154(b) by 46 days.

(21) Appl. No.: 17/416,756

(22) PCT Filed: Dec. 11, 2019

(86) PCT No.: PCT/JP2019/048461
§ 371 (c)(1),
(2) Date: Jun. 21, 2021

(87) PCT Pub. No.: WO2020/129769
PCT Pub. Date: Jun. 25, 2020

(65) Prior Publication Data
US 2022/0074010 A1    Mar. 10, 2022

(30) Foreign Application Priority Data
Dec. 20, 2018    (JP) .................................. 2018-238573

(51) Int. Cl.
*B24C 1/10*    (2006.01)
*C21D 9/28*    (2006.01)
(Continued)

(52) U.S. Cl.
CPC ................. *C21D 9/28* (2013.01); *B24C 1/10* (2013.01); *B24C 11/00* (2013.01); *C21D 7/06* (2013.01); *G01L 3/102* (2013.01)

(58) Field of Classification Search
CPC ..... C21D 9/28; C21D 7/06; B24C 1/10; B24C 11/00; G01L 3/102; H01L 41/47
See application file for complete search history.

(56) References Cited

U.S. PATENT DOCUMENTS 5,019,182 A * 5/1991 Arimi ...................... C21D 7/06
148/226
5,205,145 A * 4/1993 Ishino ..................... G01L 3/103
29/90.7
(Continued)

FOREIGN PATENT DOCUMENTS

CN    108303203 A    7/2018
JP    05-066165 A    3/1993
(Continued)

OTHER PUBLICATIONS

Kazuyoshi Ogawa et al., "Improvement in Fatigue Strength of Carburized Steel Gears with Shot Peening and Chemical Polishing", R&D Review of Toyota CRDL, Mar. 1995, pp. 37-44, vol. 30, No. 1.

(Continued)

*Primary Examiner* — Ryan J. Walters
(74) *Attorney, Agent, or Firm* — Sughrue Mion, PLLC

(57) ABSTRACT

A method for manufacturing a magnetostrictive torque sensor shaft (100) to which a sensor portion (2) of a magnetostrictive torque sensor (1) is to be attached includes: a heat treatment step of subjecting an iron-based shaft member to a carburizing, quenching, and tempering process; a shot peening step of performing shot peening using a steel shot media having a Vickers hardness at least equal to 1100 and at most equal to 1300, at least in a position on the shaft member, after the heat treatment step, to which the sensor portion (2) is to be attached; and a surface polishing step of subjecting the shaft member after the shot peening to surface polishing.

5 Claims, 8 Drawing Sheets

(51) Int. Cl.
  *B24C 11/00* (2006.01)
  *C21D 7/06* (2006.01)
  *G01L 3/10* (2006.01)

(56) References Cited

U.S. PATENT DOCUMENTS

| | | | |
|---|---|---|---|
| 6,153,023 A * | 11/2000 | Rokutanda | B24C 11/00 148/318 |
| 2003/0005736 A1 * | 1/2003 | Inoue | B24C 1/10 72/53 |
| 2016/0107292 A1 * | 4/2016 | Sawada | B24C 11/00 72/53 |
| 2018/0195142 A1 * | 7/2018 | Nakamura | H01L 41/47 |
| 2022/0026294 A1 * | 1/2022 | Fukuda | G01L 3/102 |

FOREIGN PATENT DOCUMENTS

| | | |
|---|---|---|
| JP | 11-200009 A | 7/1999 |
| JP | 2002-036115 A | 2/2002 |
| JP | 2014-213441 A | 11/2014 |
| JP | 2018-112451 A | 7/2018 |

OTHER PUBLICATIONS

International Search Report for PCT/JP2019/048461, dated Mar. 10, 2020.
Extended European Search Report dated Aug. 17, 2022, issued in European Application No. 19898666.3.
Notice of Reasons for Refusal dated Dec. 7, 2021 from the Japanese Patent Office in JP Application No. 2018-238573.
Notice of Reasons for Refusal dated Apr. 19, 2022 from the Japanese Patent Office in JP Application No. 2018-238573.
International Preliminary Report on Patentability with the translation of Written Opinion dated Jul. 1, 2021 from the International Bureau in International Application No. PCT/JP2019/048461.
Office Action dated Feb. 8, 2023 in Chinese Application No. 201980084097.X.

* cited by examiner

METHOD FOR MANUFACTURING MAGNETOSTRICTIVE TORQUE SENSOR SHAFT

CROSS REFERENCE TO RELATED APPLICATIONS

This application is a National Stage of International Application No. PCT/JP2019/048461 filed Dec. 11, 2019, claiming priority based on Japanese Patent Application No. 2018-238573 filed Dec. 20, 2018.

TECHNICAL FIELD

The present invention relates to a method for manufacturing a magnetostrictive torque sensor shaft.

BACKGROUND ART

Conventionally, a magnetostrictive torque sensor has been known. The magnetostrictive torque sensor uses a shaft having magnetostrictive characteristic whose magnetic permeability changes when stress is applied, and detects a torque applied to the shaft by detecting a change in magnetic permeability of the shaft when the torque is applied and the shaft is twisted as a change in inductance of a detecting coil.

The citation list information relating to the invention according to the present application includes Patent Document 1.

CITATION LIST

Patent Literature

Patent Document 1: JP2018-112451A

SUMMARY OF INVENTION

Technical Problem

It has been known that a steel material used for the shaft comprises a non-magnetic structure called retained austenite. The retained austenite is gamma-iron (γ-Fe) with face-centered cubic lattice structure in which the other elements are dissolved.

When the shaft includes a large amount of the non-magnetic retained austenite, the change in magnetic permeability when the torque is applied reduces, and thus it leads to decrease in sensitivity of the magnetostrictive torque sensor.

However, if the amount of the retained austenite in the entire shaft reduces by adjusting the conditions of heat treatment or the like, the toughness of the shaft may decrease, so that the shaft may be cracked.

In addition, the magnetostrictive torque sensor is used for, e.g., a transmission stroke control or an engine output control. Therefore, it is desirable to have a small error as much as possible to perform a reliable shift transmission.

Therefore, it is an object of the present invention to provide a method for manufacturing a magnetostrictive torque sensor shaft capable of improving sensor sensitivity and reducing an error while securing toughness.

Solution to Problem

For solving the above-mentioned problems, the object of the present invention is to provide a method for manufacturing a magnetostrictive torque sensor shaft to which a sensor portion of the magnetostrictive torque sensor is to be attached, the method comprising heat treatment step of subjecting an iron-based shaft member to a carburizing, quenching, and tempering process, a shot peening step of performing shot peening using a steel shot media having a Vickers hardness at least equal to 1100 and at most equal to 1300, at least in a position on the shaft member, after the heat treatment step, to which the sensor portion is to be attached, and a surface polishing step of subjecting the shaft member after the shot peening to surface polishing.

Advantageous Effects of Invention

According to the present invention, it is possible to provide a method for manufacturing a magnetostrictive torque sensor shaft capable of improving sensor sensitivity and reducing errors while securing toughness.

DESCRIPTION OF EMBODIMENTS

Embodiments

Embodiments of the present invention will be explained in conjunction with appended drawings.

(Explanation of a Magnetostrictive Torque Sensor)

Figure 1A:
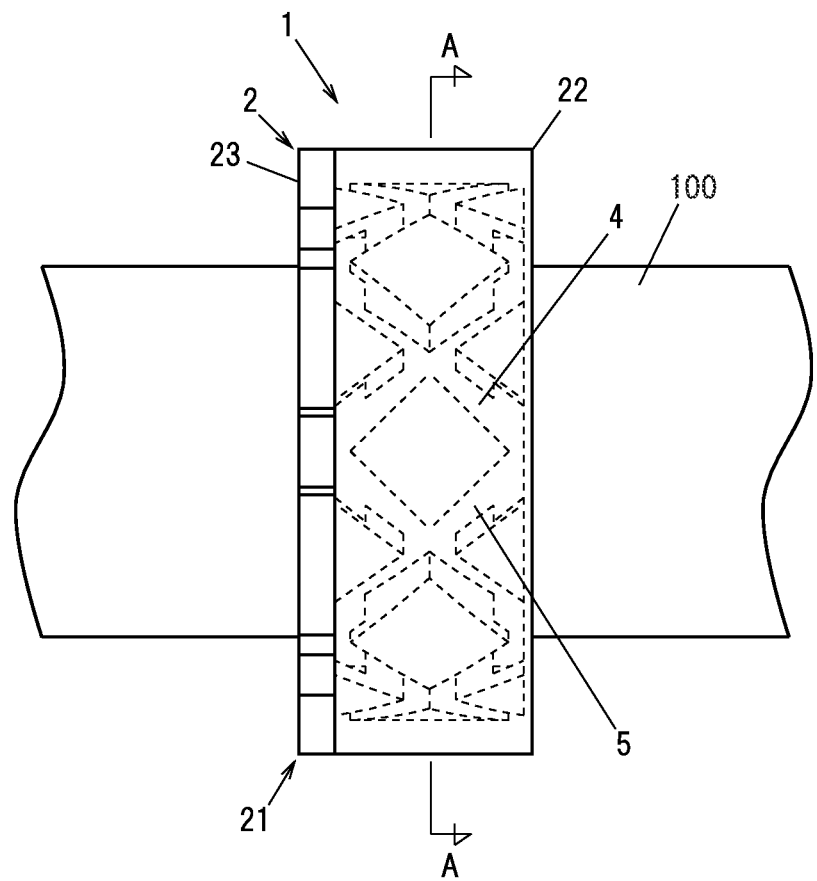
FIG. 1A is a side view showing an example of a sensor portion of a magnetostrictive torque sensor that is attached to a shaft.
Figure 1B:
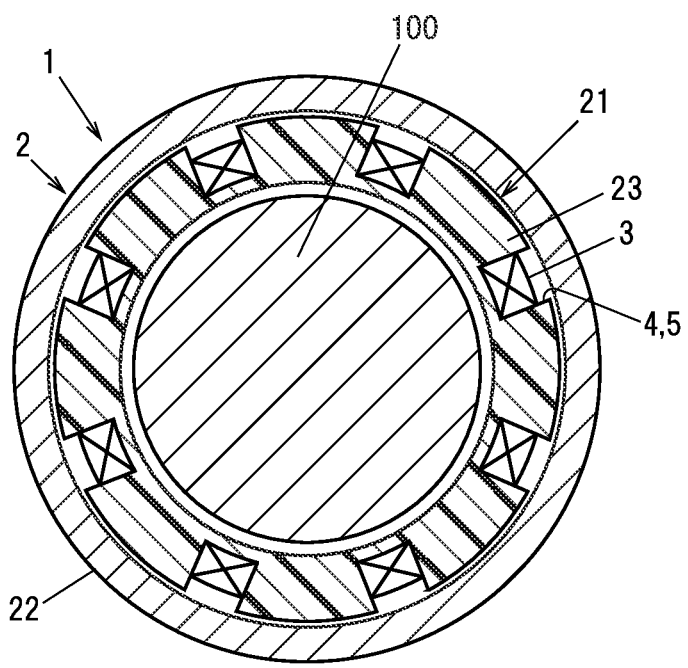
FIG. 1B is a cross-sectional view taken along line A-A in FIG. 1A.
Figure 2A:
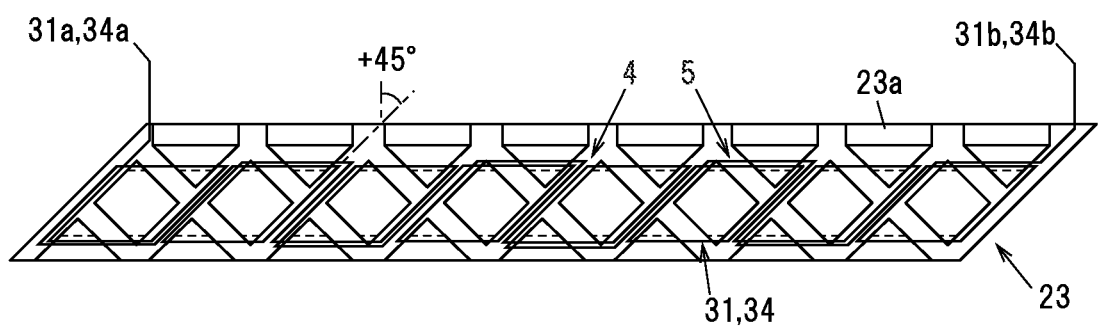
FIG. 2A is a plan view schematically showing a state in which a bobbin is deployed, which illustrates a first detecting coil and a fourth detecting coil.
Figure 2B:
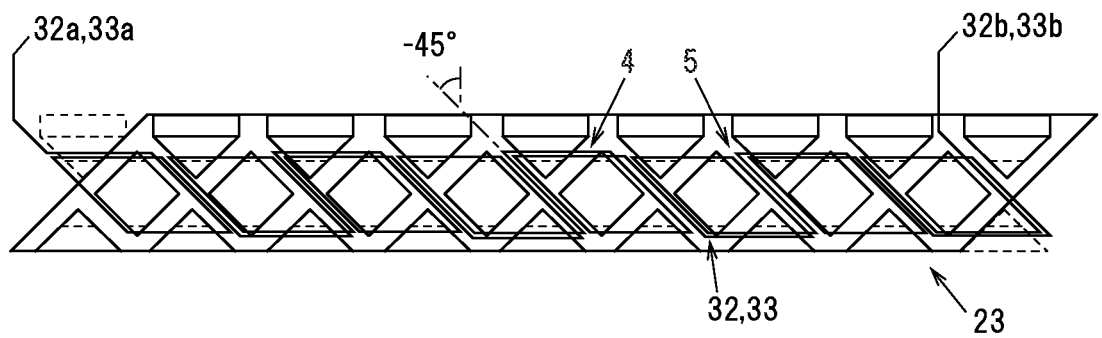
FIG. 2B is a plan view schematically showing a state in which the bobbin is deployed, which illustrates a second detecting coil and a third detecting coil.
Figure 3:
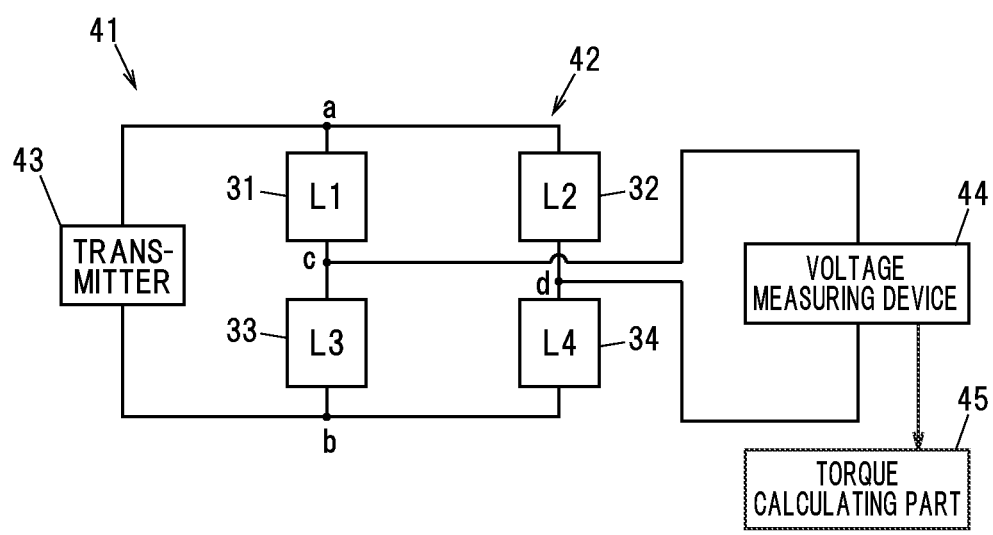
FIG. 3 is a circuit diagram showing an example of a measuring part for measuring torque applied to the shaft by detection signal of the torque sensor.

Firstly, a magnetostrictive torque sensor (hereinafter simply referred to as a torque sensor) will be explained. FIG. 1A is a side view showing an example of a sensor portion of the torque sensor that is attached to a shaft. FIG. 1B is a cross-sectional view taken along line A-A in FIG. 1A. FIG. 2A is a plan view schematically showing a state in which a bobbin is deployed, which illustrates a first detecting coil and a fourth detecting coil. FIG. 2B is a plan view schematically showing a state in which the bobbin is deployed, which illustrates a second detecting coil and a third detecting coil. FIG. 3 is a circuit diagram showing an example of a measuring part to measure torque applied to the shaft by detection signal of the torque sensor.

As shown in FIGS. 1A and 1B, the sensor portion 2 of the torque sensor 1 is attached around a magnetostrictive torque sensor shaft (hereinafter, simply referred to as a shaft) 100 having magnetostrictive characteristics. The torque sensor 1 measures torque (rotational torque) applied to the shaft 100.

The shaft 100 comprises a material having magnetostrictive characteristics (such as SCr420, SCM420, SNCM616, SUS440C, and SUS630), and is formed in a cylindrical shape (rod shape). For example, the shaft 100 is used for torque transmission in a powertrain system of a vehicle or a torque transmission in an engine of a vehicle.

The sensor portion 2 comprises a coil 21 and a magnetic ring 22. The magnetic ring 22 comprises a magnetic material (a ferromagnetic material) and is formed in a hollow cylindrical shape. The coil 21 is inserted into a hollow portion of the magnetic ring 22. The magnetic ring 22 serves to suppress leakage of a magnetic flux generated by the detecting coil 3 of the coil 21 to the outside, thereby decreasing the sensitivity.

The coil 21 comprises a bobbin 23 comprising a non-magnetic resin, and a plurality of detecting coils 3 formed by winding insulated wires around an outer periphery of the bobbin 23. The bobbin 23 is provided coaxially with the shaft 100 in such a manner as to be separated from the shaft 100, and is formed in a hollow cylindrical shape. A plurality of first inclined grooves 4 inclined at a predetermined angle (herein +45°) with respect to an axial direction of the shaft 100 and a plurality of second inclined grooves 5 inclined at a predetermined angle (herein −45°) with respect to a direction opposite to the first inclined grooves 4 along the axial direction are formed on an outer peripheral surface of the bobbin 23. The first inclined grooves 4 and the second inclined grooves 5 are formed of grooves concaved in a radial direction of the bobbin 23.

As shown in FIGS. 2A and 2B, the coil 21 comprises first to fourth detecting coils 31 to 34 as the detecting coils 3. The first detecting coil 31 and the fourth detecting coil 34 are formed by winding insulated wires around the bobbin 23 along the first inclined grooves 4. The second detecting coil 32 and the third detecting coil 33 are formed by winding insulated wires around the bobbin 23 along the second inclined grooves 5.

In FIG. 2A, reference signs 31a and 31b respectively indicate input and output ends of one layer of the first detecting coil 31, and reference signs 34a and 34b respectively indicate input and output ends of one layer of the fourth detecting coil 34. In FIG. 2B, reference signs 32a and 32b respectively indicate input and output ends of one layer of the second detecting coil 32, and reference signs 33a and 33b respectively indicate input and output ends of one layer of the third detecting coil 33. In addition, FIGS. 2A and 2B shows winding of the insulated wires for one turn. Each of the detecting coils 31 to 34 is formed by repeatedly winding the insulated wires to a target number of turns. In addition, the method for winding the insulated wires shown in FIGS. 2A and 2B is merely an example. The detecting coils 31 to 34 may be formed by using the other methods of winding.

The first detecting coil 31 and the fourth detecting coil 34 are provided for detecting a change in magnetic permeability of the shaft 100 in a first direction inclined at a predetermined angle (herein +45°) with respect to the axial direction of the shaft 100. The second detecting coil 32 and the third detecting coil 33 are provided for detecting a change in magnetic permeability of the shaft 100 in a second direction inclined at the predetermined angle (herein −45°) opposite to the first direction along the axial direction of the shaft 100.

As shown in FIG. 3, a measuring part 41 measures the torque applied to the shaft 100 by detecting changes in inductance of the first to fourth detecting coils 31 to 34.

The measuring part 41 comprises a bridge circuit 42 configured by annularly arranging the first detecting coil 31, the second detecting coil 32, the fourth detecting coil 34, and the third detecting coil 33 in this order, a transmitter 43 for applying alternating current (AC) voltage between a contact point a arranged between the first detecting coil 31 and the second detecting coil 32 and a contact point b arranged between the third detecting coil 33 and the fourth detecting coil 34, a voltage measuring circuit 44 for detecting voltage between a contact point c arranged between the first detecting coil 31 and the third detecting coil 33 and a contact point d arranged between the second detecting coil 32 and the fourth detecting coil 34, and a torque calculating part 45 for calculating a torque applied to the shaft 100 based on the voltage measured by the voltage measuring circuit 44. The bridge circuit 42 is configured by arranging the first detecting coil 31 and the fourth detecting coil 34 at one of two sides facing each other, and arranging the second detecting coil 32 and the third detecting coil 33 at the other of the two sides facing each other.

In the measuring part 41, inductances L1 to L4 of the first to fourth detecting coil 31 to 34 are equal when the torque is not applied to the shaft 100, and the voltage detected by the voltage measuring circuit 44 becomes approximately zero.

When the torque is applied to the shaft 100, the magnetic permeability in the direction of +45° with respect to the axial direction decreases (or increases) while the magnetic permeability in the direction of −45° with respect to the axial direction increases (or decreases). Thus, the inductances in the first detecting coil 31 and the fourth detecting coil 34 decrease (or increase) while the inductances in the second detecting coil 32 and the third detecting coil 33 increase (or decrease), when the torque is applied to the shaft 100 while the AC voltage is applied from the transmitter 43. As a result, the voltage detected by the voltage measuring circuit 44 changes, and thus the torque calculating part 45 calculates the torque applied to the shaft 100 based on the change in voltage.

Since the first detecting coil 31 and the fourth detecting coil 34 have the same structure as the second detecting coil 32 and the third detecting coil 33 except the winding direction being different, the effects of the temperature or the like on the inductances of the first to fourth detecting coils 31 to 34 can be canceled by using the bridge circuit 42 shown in FIG. 3. And thus, the torque applied to the shaft 100 can be accurately detected. In addition, for the torque sensor 1, when the inductances in the first detecting coil 31 and the fourth detecting coil 34 increase (or decrease), while the inductances in the second detecting coil 32 and the third detecting coil 33 decrease (or increase). Thus, the detection sensitivity can be further improved by using the bridge circuit 42 shown in FIG. 3.

(Explanation of the Shaft 100 and Method for Manufacturing the Same)

In the present embodiment, an iron-based shaft member subjected to a carburizing, quenching and tempering process, thereafter shot peening, and then surface polishing is used as the shaft 100.

That is, the method for manufacturing the shaft 100 according to the present embodiment comprises a heat treatment step of subjecting an iron-based shaft member to a carburizing, quenching, and tempering process, a shot peening step of performing shot peening at least in a position on the shaft member, after the heat treatment step, to which the sensor portion is to be attached, and a surface polishing step of subjecting the shaft member after the shot peening to surface polishing.

For the shaft member used for the shaft 100, iron-based materials such as SCr420 (chromium steel), SCM420 (chromium-molybdenum steel), SNCM616 (nickel-chromium molybdenum steel), SUS440C (martensitic stainless), SUS630 (precipitation hardening stainless steel), and the like can be used. In the present embodiment, SCr420 is used for the shaft member.

The mechanical strength including the toughness of the shaft 100 can be enhanced by performing the carburizing, quenching, and tempering process on the entire shaft member. In the present embodiment, surface hardness of the shaft member after the heat treatment step is determined as not less than HV (Vickers hardness) 650. This is because if the surface hardness of the shaft member after the heat treatment step is low, the sensor sensitivity may decrease, or the hysteresis error may increase. The surface hardness of the shaft member after the heat treatment step is preferably at least equal to HV 650 in order to suppress deterioration of the sensor sensitivity and the hysteresis error. That is, in the heat treatment step, it is preferable to perform heat treatment in such a manner that the surface hardness of the shaft member after the heat treatment step is not less than HV 650. In the present embodiment, the heat treatment step is performed by gas carburization (at 920° C. for 3 hours, then at 830° C. for 15 min, and then oil quenching and tempering at 200° C. for 1.5 hours).

The shaft member is crooked when being subjected to the heat treatment step. Thus, it is preferable to perform a step of press-unbending the shaft member and a grinding step of grinding the surface of the shaft member to provide the shaft member with a straight shape, in addition to the heat treatment step. In the grinding step, it is preferable to perform grinding in such a manner that a grinding amount (grinding depth) at the part (referred to as the measuring part), to which the sensor portion 2 is to be attached, is even in the circumferential direction. This is because that a composition varies along the depth direction (radial direction) of the shaft member, and when the grinding amount (grinding depth) is uneven in the measuring part, portions with different compositions are generated on the surface of the measuring part and may cause the angle errors to be described later. In order to obtain the desired outer diameter after the grinding step, the shaft member before the heat treatment is preferably slightly larger than the finished outer diameter (for example, the shaft member before the heat treatment having a diameter of about 0.2 mm).

In the shot peening step, the shaft member after the heat treatment is subjected to the shot peening. Martensitic transformation (diffusionless transformation) occurs at the surface (a region distant with a predetermined depth from the surface) of the shaft 100 by shot peening the shaft member after heat treatment, so that non-magnetic retained austenite decreases, and ferromagnetic martensite can increase. As a result, the change in magnetic permeability when the torque is applied increases by reducing the non-magnetic area on the surface of the shaft 100 and increasing the magnetic area on the surface of the shaft 100. And thus, the sensitivity of the torque sensor 1 can be improved. The retained austenite is iron (γ-Fe) with face-centered cubic lattice structure in which the other elements are dissolved. The martensite is a solid solution in which carbon enters into a crystal of iron with body-centered tetragonal lattice structure.

In addition, the surface of the shaft member is work hardened by shot peening the shaft member after the heat treatment and thus the hysteresis characteristic is improved. More specifically, by shot peening the shaft member after the heat treatment, the magnetic domains (areas in which the direction of the magnetic moment is aligned) on the surface of the shaft 100 are subdivided, and the retained austenite serving as a pinning site for preventing movement of the magnetic domain wall, which is the boundary of the magnetic domains, is reduced. As a result, when the applied torque is released, the magnetic domains and the magnetic walls will be easily returned to the original state, and thus the hysteresis error decreases.

Figure 4A:
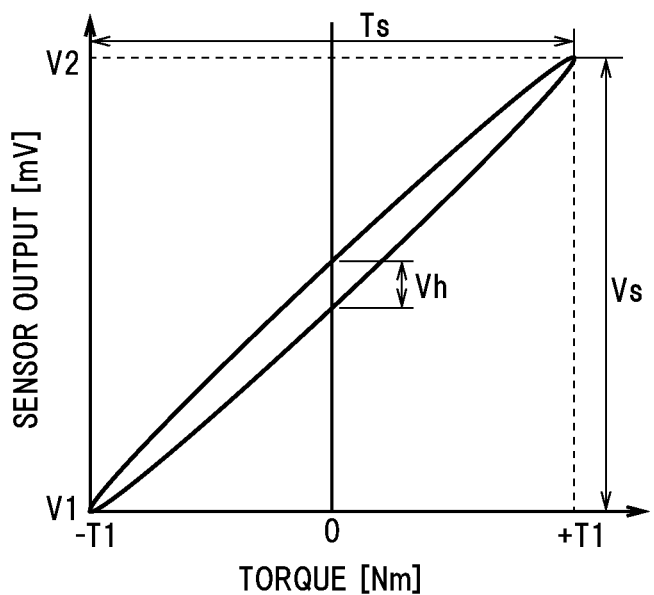
FIG. 4A is a diagram that illustrates sensitivity and hysteresis error.

As shown in FIG. 4A, the sensitivity of the torque sensor 1 is defined by dividing the sensor output V (mV) by the torque T (Nm) applied to the shaft 100, and expressed as V/T (mV/Nm). The sensor sensitivity is expressed as $(V2-V1)/(T2 \times T1)=Vs/Ts$, where the torque T applied to the shaft 100 is not less than −T1 and not more than +T1, the sensor output corresponding to the torque −T1 is V1, and the sensor output corresponding to the torque +T1 is V2. The hysteresis error, which is also referred to as a linearity error, is a ratio of the maximum value Vh of a sensor output difference at the same torque between the torque increase and the torque decrease with respect to the sensor output Vs ($=V2-V1$), and is expressed as Vh/Vs (% FS, FS means a full-scale).

Figure 4B:
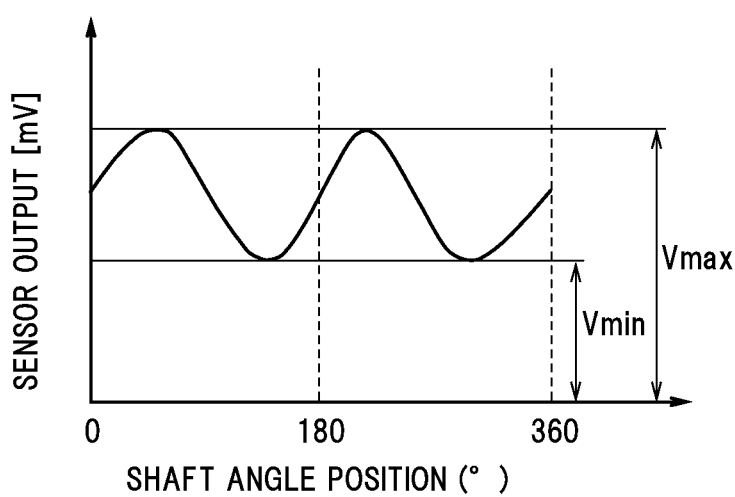
FIG. 4B is a diagram that illustrates an angle error.

In the present embodiment, in addition to the hysteresis error, the variation of the sensor output in the circumferential direction of the shaft 100 (hereinafter referred to as the angle error) is evaluated. As shown in FIG. 4B, the angle error means an error generated when the shaft is rotated. The angle error is expressed as (Vmax−Vmin)/Vs (%), where the maximum value of the sensor output is Vmax and the minimum value is Vmin. Hereinafter, the sum of the hysteresis error and the angle error is referred to as a total error. In the present embodiment, a target value of the total error is not more than 3.5%.

In the present embodiment, chromium steel (SCr420) was used as the shaft member of the shaft 100, and optimum shot peening conditions was studied. In the present embodiment, a steel shot media having a particle diameter of 0.6 mm was used. The diameter of the shaft 100 was set as 18 mm. When performing the shot peening, the shot media was injected while rotating the shaft 100 at a low speed (e.g., 6 rpm).

Figure 5A:
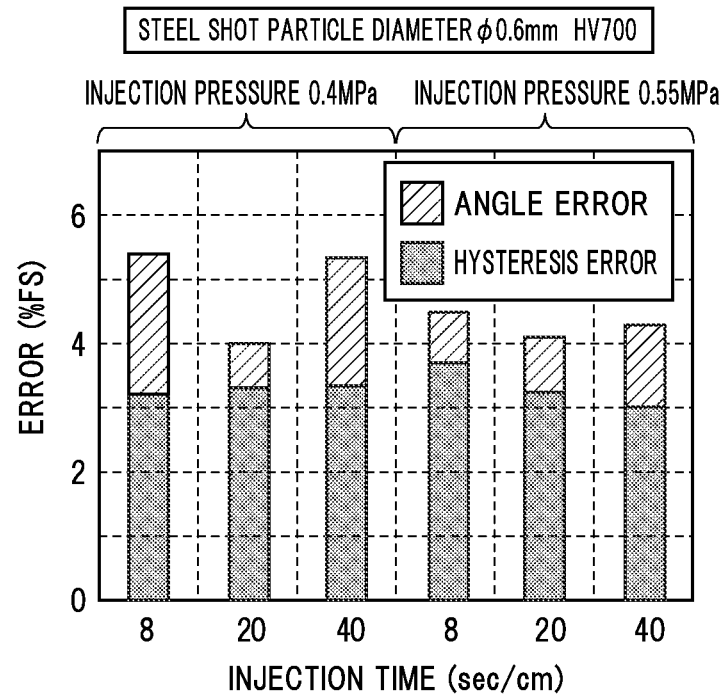
FIG. 5A is a diagram showing a measurement result of an error when a steel shot media having a Vickers hardness of 700 is used.

Firstly, FIG. 5A shows error measuring result when using a steel shot media having the Vickers hardness of 700 (HV) and setting injection pressure as 0.4 MPa and 0.55 MPa. As shown in FIG. 5A, the total error is increased to not less than 4% when using the shot media having the Vickers hardness of 700 (HV). The error (hysteresis error and angle error) shown in FIG. 5A represents the maximum value including temperature characteristics (measured under conditions of ambient temperature from −40° C. to 150° C.). The horizontal axis of FIG. 5A represents the injection time of the shot media, and the injection time of the shot media is represented by dividing the total injection time by the length of the shaft 100. That is, the injection time of the shot media represents the injection time per 1 cm in the axial direction of the shaft 100 (hereinafter, simply referred to as the injection time).

Figure 5B:
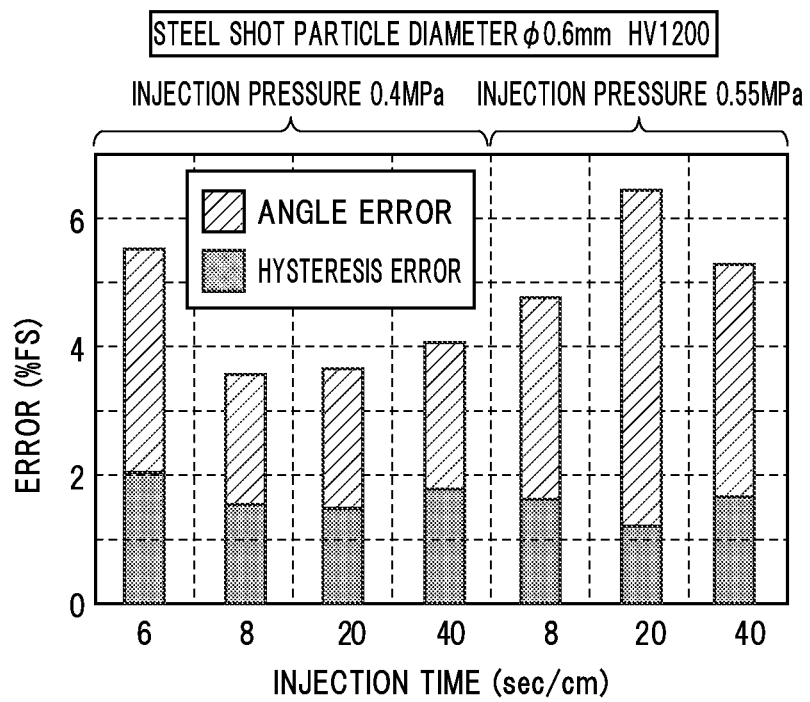
FIG. 5B is a diagram showing a measurement result of an error when a steel shot media having a Vickers hardness of 1200 is used.

Next, FIG. 5B shows error measuring result when using a steel shot media having the Vickers hardness of 1200 (HV) and setting injection pressure as 0.4 MPa and 0.55 MPa. In the meantime, since there is a variation in hardness of the shot media, the shot media may have the Vickers Hardness of not less than 1100 and not more than 1300 (HV). As shown in FIG. 5B, when using the shot media having the Vickers hardness of 1200 (HV), the hysteresis error decreases as compared with the case using the shot media having the Vickers hardness of 700 (HV). Meanwhile, the angle error increases. As a result, the total error increases.

Figure 6A:
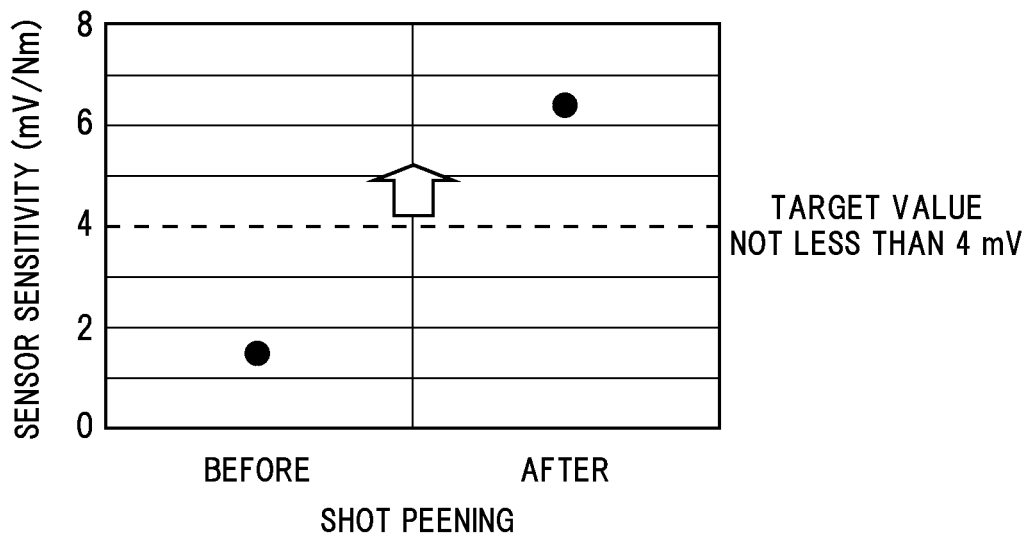
FIG. 6A is a graphical diagram showing sensor sensitivity before and after shot peening.
Figure 6B:
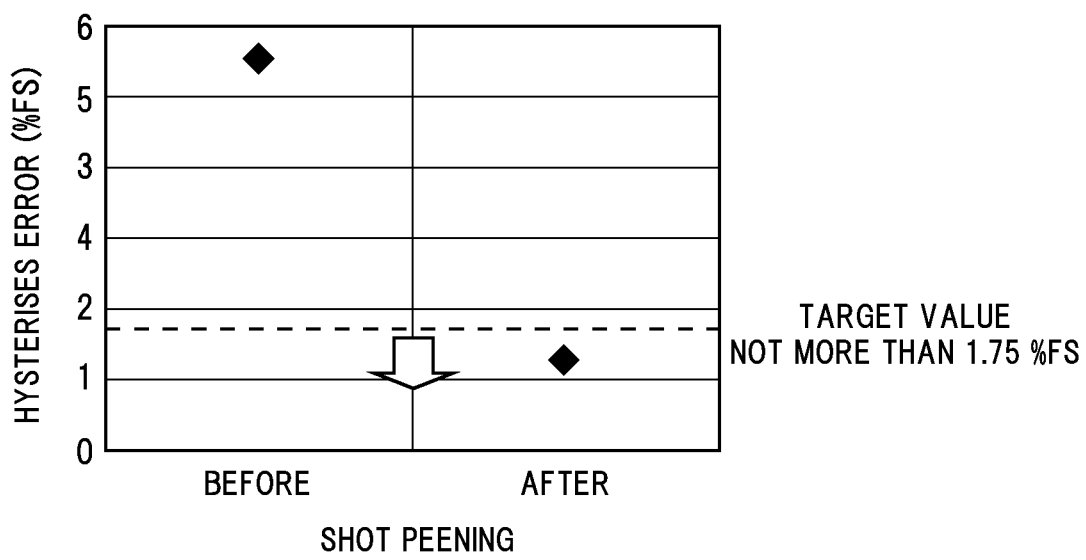
FIG. 6B is a graphical diagram showing hysteresis errors before and after the shot peening.

In the present embodiment, the shot media having the particle diameter of not less than 0.6 mm was used, and the injection pressure was set as not less than 0.4 MPa and not more than 0.55 MPa. As clearly understood from the result shown in FIG. 5B, when using the shot media having the particle diameter of 0.6 mm, it is preferable to set the shot condition with the injection pressure of 0.4 MPa and the injection time of not less than 8 sec/cm and not more than 20 sec/cm, in order to reduce the total error. In the present embodiment, the shot peening was performed under the shot condition with the injection pressure of 0.4 MPa and the injection time of 8 sec/cm. As shown in FIG. 6A, the sensor sensitivity of 1.5 mV/Nm before shot peening can be improved to 6.4 mV/Nm by shot peening under the above-mentioned shot condition. The sensor sensitivity of not less than 4.0 mV/Nm that is set as the target value was obtained. Also, as shown in FIG. 6B, the hysteresis error of 5.5% FS before shot peening was reduced to 1.3% FS, and the hysteresis error of not more than 1.75% FS that is set as the target value was achieved.

As described above, it was found that the total error cannot be reduced only by increasing the hardness of the shot media. Therefore, the inventors studied the reason why the angle error increases. As the result of study, the inventors have found that the angle error is largely increased by two factors.

Figure 7A:
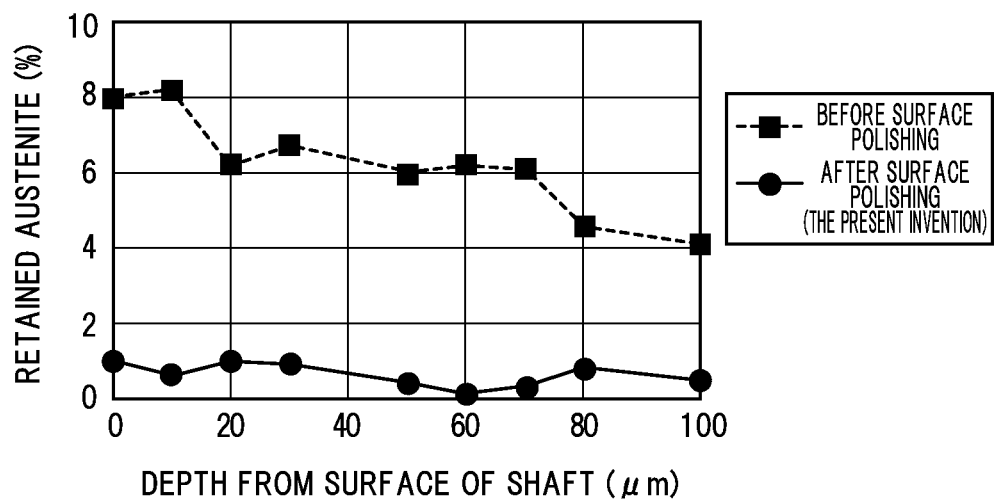
FIG. 7A is a graphical diagram showing distribution in a depth direction of an amount of retained austenite before and after surface polishing.

The first factor is that the retained austenite remaining in the shot peening step is not uniformly distributed in the circumferential direction of the shaft 100. As described above, the retained austenite is transformed into martensite by deformation inducing and a non-magnetic region is magnetized, and at the same time, the retained austenite region which is easily plastically deformed can be reduced to achieve high hardness of the surface by shot peening. As a result, improvement of the sensor sensitivity and reduction of the hysteresis error can be achieved at the same time. However, the retained austenite is not completely removed, and the retained austenite remains on the surface of the shaft member after shot peening, as shown by the dashed line in FIG. 7A.

Figure 7B:
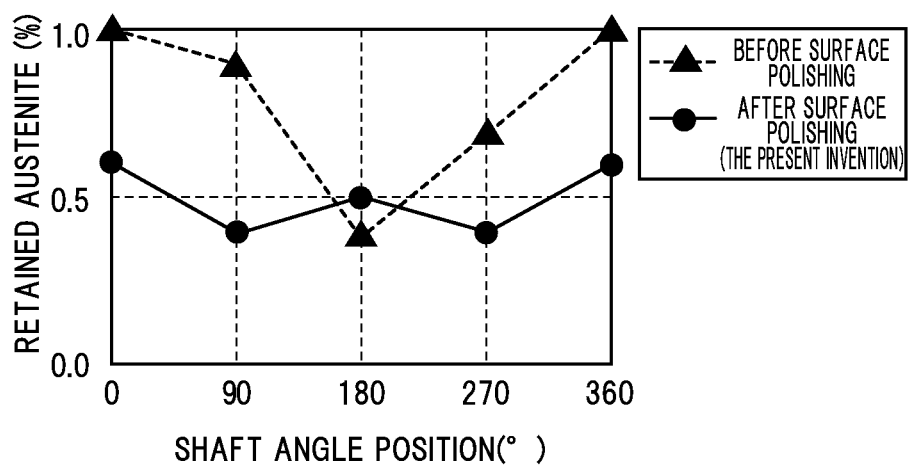
FIG. 7B is a graphical diagram showing distribution in a circumferential direction of the amount of the retained austenite on a surface of shaft member before and after the surface polishing.

Here, as shown by the dashed line in FIG. 7B, when measuring the amount of retained austenite by each angular position of the shaft member after shot peening, it was found that the amount of retained austenite varies from 0.4% to 1.0%. Since the retained austenite is non-magnetic, the angle error increases when the distribution of retained austenite varies in the circumferential direction in the measuring part. It is believed that such variations in retained austenite cannot be sufficiently eliminated only by shot peening.

Figure 8:
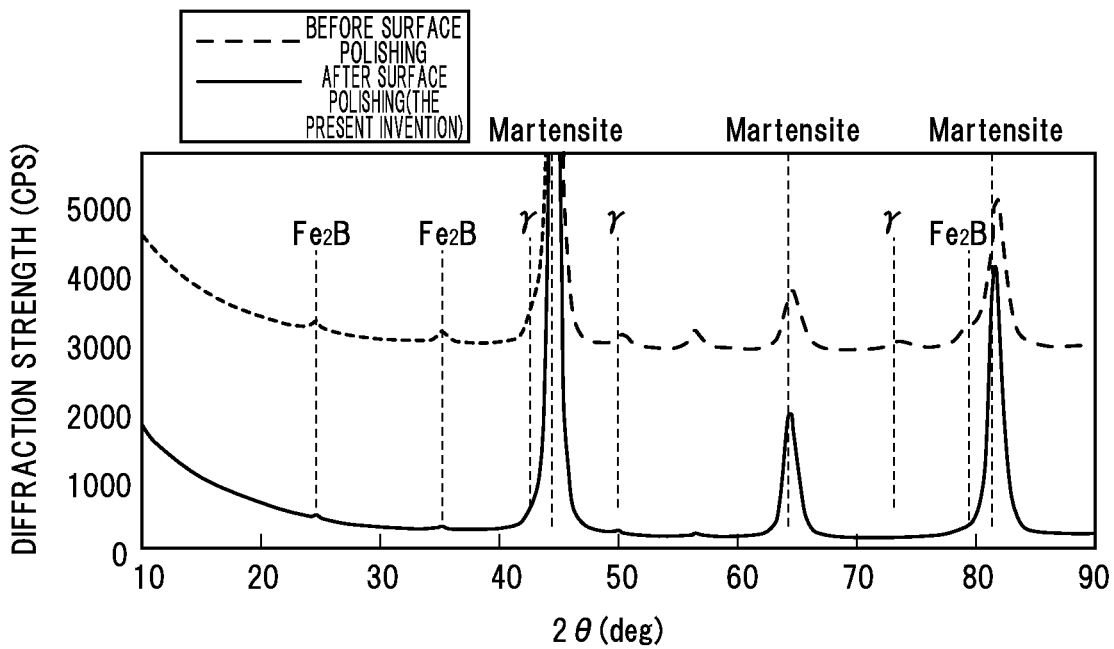
FIG. 8 is a graphical diagram showing X-ray diffraction results of the surface of the shaft member before and after the surface polishing.

The second factor is that $Fe_2B$ is generated on the surface of the shaft member by the effect of boron contained in the shot media. Boron is added to the steel shot media having the Vickers hardness of 1200 (HV) to increase the hardness of the shot media. Thus, $Fe_2B$ is formed on the surface of the shaft member by using such the shot media. Since $Fe_2B$ is considered to have a large angle error due to the large crystal magnetic anisotropy, as shown by the dashed line in FIG. 8, it was confirmed that $Fe_2B$ is formed on the surface of the shaft member when analyzing the surface of the shaft member after shot peening by using the X-ray diffraction apparatus.

Therefore, in the present embodiment, the surface polishing step for surface polishing the shaft member after shot peening was performed in order to eliminate these two factors and to improve the angle error. In the surface polishing step, the surface of the shaft member may be polished by using, e.g., a polishing paper referred to as water paper or water-resistant paper. The arithmetic average roughness Ra of the surface of the substrate after polishing was 0.3 μm, and the maximum height Rz was 3 μm.

The stress in surface polishing accelerates the martensitic transformation by surface polishing the shaft member after shot peening. And thus, the distribution of the retained austenite can be made uniform. The distribution of the retained austenite after polishing is shown by solid lines in FIGS. 7A and 7B. As shown by the solid line in FIGS. 7A and 7B, it will be understood that the amount of the retained austenite was reduced by surface polishing the shaft member after shot peening, and the variation in the amount of the retained austenite by the angular position is suppressed to approximately 0.2% (0.4 to 0.6%).

Further, $Fe_2B$ formed on the surface of the shaft member in shot peening is removed by surface polishing the shaft member after shot peening. The results of analysis of the shaft member after surface polishing by the X-ray diffraction device are shown by the solid line in FIG. 8. As shown by the solid line in FIG. 8, it will be understood that the surface of the shaft member after surface polishing has low $Fe_2B$ (volume ratio decreases).

In the surface polishing step, surface polishing may be performed in such a manner that the arithmetic average roughness Ra of the surface of the shaft member is not more than 0.3 μm and the maximum height Rz is not more than 3 μm. This is because when the arithmetic average roughness Ra of the surface of the shaft member is greater than 0.3 μm or the maximum height Rz is greater than 3 μm, the surface polishing is not sufficient, and uniformization of the distribution of retained austenite and the removal of $Fe_2B$ may not be sufficiently performed.

Figure 9:
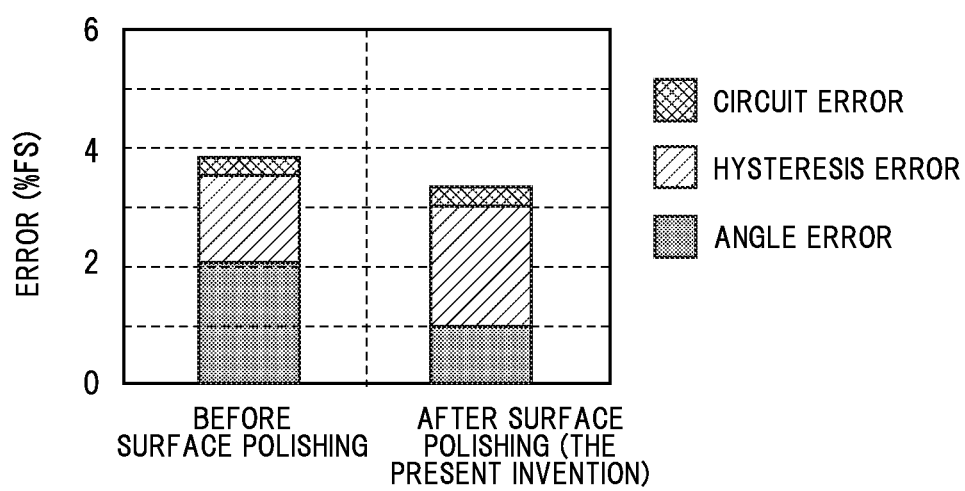
FIG. 9 is a diagram showing a measurement result of errors before and after surface polishing.

In this way, the uniformization of the distribution of the retained austenite and the removal of $Fe_2B$ formed on the surface of the shaft member can be achieved at the same time by surface polishing the shaft member after shot peening. As a result, the angle error can be greatly reduced. As shown in FIG. 9, in the shaft 100 after surface polishing, the angle error is significantly reduced as compared to the shaft member before surface polishing (after shot peening).

Specifically, the shaft 100 can have the hysteresis error of approximately 2%, the angle error of approximately 1%, and the total error of not more than 3.5%. Even though the circuit error caused by the detection circuit is included, it is possible to provide the sum of the errors of not more than 3.5%, and to achieve the torque sensor 1 having a significantly small error. FIG. 9 shows using the steel shot media having the particle diameter of 0.6 mm and the Vickers hardness of 1200 (HV) and shot peening under the injection pressure of 0.4 MPa and the injection time of 8 sec/cm.

(Effect of the Embodiment)

As described above, the method for manufacturing the torque sensor 1 according to the present embodiment comprises heat treatment step of subjecting an iron-based shaft member to a carburizing, quenching, and tempering process, a shot peening step of performing shot peening using a steel shot media having a Vickers hardness at least equal to 1100 and at most equal to 1300, at least in a position on the shaft member, after the heat treatment step, to which the sensor portion is to be attached, and a surface polishing step of subjecting the shaft member after the shot peening to surface polishing.

The non-magnetic retained austenite can decrease only on the surface of the shaft 100 by providing the shot peening step, and thus the deterioration of the toughness of the shaft 100 can be suppressed. The hysteresis error can decrease and the sensor sensitivity can be improved by performing shot peening step with using a shot media having the high hardness of 1200 (HV). However, the angle error may increase due to the influence of boron included in the shot media. In the present embodiment, by surface polishing the shaft member after shot peening, the distribution in the circumferential direction of the retained austenite is uniformized, and $Fe_2B$ formed on the surface of the shaft member due to the boron included in the shot media can be removed, so that the angle error can decrease. As a result, it is possible to achieve the torque sensor 1 having high sensor sensitivity while securing toughness and having the total error of not more than 3.5%.

SUMMARY OF THE INVENTION

Next, the technical concept grasped from the above-described embodiment is described with reference to the signs or the like in the embodiment. However, each reference sign or the like in the following description is not limited to a member or the like specifically showing the elements in the following claims in the embodiment.

[1] A method for manufacturing a magnetostrictive torque sensor shaft (100) to which a sensor portion (2) of a magnetostrictive torque sensor (1) is to be attached, the method comprising: heat treatment step of subjecting an iron-based shaft member to a carburizing, quenching, and tempering process; a shot peening step of performing shot peening using a steel shot media having a Vickers hardness at least equal to 1100 and at most equal to 1300, at least in a position on the shaft member, after the heat treatment step, to which the sensor portion (2) is to be attached; and a surface polishing step of subjecting the shaft member after the shot peening to surface polishing.

[2] The method for manufacturing the magnetostrictive torque sensor shaft according to [1], wherein the surface polishing step is performed in such a manner that an arithmetic average roughness Ra of a surface of the shaft member is not more than 0.3 μm and a maximum height Rz is not more than 3 μm.

[3] The method for manufacturing the magnetostrictive torque sensor shaft according to [1] or [2], wherein the shaft member comprises chromium steel.

[4] The method for manufacturing the magnetostrictive torque sensor shaft according to any one of [1] to [3], wherein the heat treatment step is performed in such a manner that a surface hardness of the shaft member after the heat treatment step comprises the Vickers hardness of not less than 650 HV.

[5] The method for manufacturing the magnetostrictive torque sensor shaft according to any one of [1] or [4], wherein the shot media having a particle diameter of not less than 0.6 mm is used, and an injection pressure is set as not less than 0.4 MPa and not more than 0.55 MPa in the shot peening step.

Although the embodiments of the invention have been described, the invention according to claims is not to be limited to the embodiments. In addition, please note that all combinations of the features described in the embodiments are not necessary to solve the problem of the invention. Furthermore, the various kinds of modifications can be implemented without departing from the gist of the invention.

INDUSTRIAL APPLICABILITY

To provide a method for manufacturing a magnetostrictive torque sensor shaft capable of improving sensor sensitivity and reducing an error while securing toughness.

REFERENCE SIGNS LIST

1 TORQUE SENSOR (MAGNETOSTRICTIVE TORQUE SENSOR)
2 SENSOR PORTION
3 DETECTING COIL
100 SHAFT (MAGNETOSTRICTIVE TORQUE SENSOR SHAFT)

The invention claimed is:

1. A method for manufacturing a magnetostrictive torque sensor shaft to which a sensor portion of the magnetostrictive torque sensor is to be attached, the method comprising:
   heat treatment step of subjecting an iron-based shaft member to a carburizing, quenching, and tempering process;
   a shot peening step of performing shot peening using a steel shot media having a Vickers hardness at least equal to 1100 and at most equal to 1300, at least in a position on the shaft member, after the heat treatment step, to which the sensor portion is to be attached; and
   a surface polishing step of subjecting the shaft member after the shot peening to surface polishing to remove $Fe_2B$ formed on a surface of the shaft member in the shot peening.

2. The method for manufacturing the magnetostrictive torque sensor shaft according to claim 1, wherein the surface polishing step is performed in such a manner that an arithmetic average roughness Ra of a surface of the shaft member is not more than 0.3 μm and a maximum height Rz is not more than 3 μm.

3. The method for manufacturing the magnetostrictive torque sensor shaft according to claim 1, wherein the shaft member comprises chromium steel.

4. The method for manufacturing the magnetostrictive torque sensor shaft according to claim 1, wherein the heat treatment step is performed in such a manner that a surface hardness of the shaft member after the heat treatment step comprises the Vickers hardness of not less than 650 HV.

5. The method for manufacturing the magnetostrictive torque sensor shaft according to claim 1, wherein the shot media having a particle diameter of not less than 0.6 mm is used, and an injection pressure is set as not less than 0.4 MPa and not more than 0.55 MPa in the shot peening step.

* * * * *